(12) United States Patent
Adkisson et al.

(10) Patent No.: US 8,232,651 B2
(45) Date of Patent: Jul. 31, 2012

(54) BOND PAD FOR WAFER AND PACKAGE FOR CMOS IMAGER

(75) Inventors: James W. Adkisson, Jericho, VT (US);
Jeffrey P. Gambino, Westford, VT (US);
Mark D. Jaffe, Shelburne, VT (US);
Richard L. Rassel, Colchester, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/343,422

(22) Filed: Jan. 4, 2012

(65) Prior Publication Data

US 2012/0098105 A1    Apr. 26, 2012

Related U.S. Application Data

(62) Division of application No. 12/582,298, filed on Oct. 20, 2009, now Pat. No. 8,119,456, which is a division of application No. 11/465,622, filed on Aug. 18, 2006, now Pat. No. 7,622,364.

(51) Int. Cl.
*H01L 23/48* (2006.01)
(52) U.S. Cl. ................. 257/758; 257/E23.011
(58) Field of Classification Search ............... 257/758, 257/E23.011, E21.499
See application file for complete search history.

(56) References Cited

U.S. PATENT DOCUMENTS

| | | | |
|---|---|---|---|
| 5,594,895 A | | 1/1997 | Raymond et al. |
| 5,834,829 A | * | 11/1998 | Dinkel et al. ............ 257/620 |
| 6,100,589 A | * | 8/2000 | Tanaka ...................... 257/758 |
| 6,130,383 A | | 10/2000 | Lamourelle |
| 6,876,064 B2 | * | 4/2005 | Matumoto et al. ........ 257/632 |
| 6,998,712 B2 | * | 2/2006 | Okada et al. ............. 257/758 |
| 7,187,742 B1 | | 3/2007 | Logue et al. |
| 7,235,864 B2 | * | 6/2007 | Lee .......................... 257/620 |
| 7,298,030 B2 | | 11/2007 | McWilliams et al. |
| 7,741,715 B2 | * | 6/2010 | Kim et al. ................. 257/758 |
| 7,777,304 B2 | * | 8/2010 | Hamatani et al. ......... 257/620 |
| 7,777,338 B2 | * | 8/2010 | Yao et al. ................. 257/758 |
| 7,825,446 B2 | * | 11/2010 | Takahashi et al. ........ 257/295 |
| 7,948,060 B2 | * | 5/2011 | Williamson et al. ...... 257/620 |

(Continued)

FOREIGN PATENT DOCUMENTS

WO    WO 2006/000929 A    1/2006

OTHER PUBLICATIONS

J. Leib, et al., "New Wafer-Level-Packaging Technology Using Silicon-Via-Contacts for Optical and Other Sensor Applications", *2004 Electronic Components and Technology Conference Proceedings*, pp. 843-847.

(Continued)

*Primary Examiner* — Lex Malsawma
(74) *Attorney, Agent, or Firm* — Scully, Scott, Murphy & Presser, P.C.; Anthony J. Canale

(57) ABSTRACT

An electronic packaging having at least one bond pad positioned on a chip for effectuating through-wafer connections to an integrated circuit. The electronic package is equipped with an edge seal between the bond pad region and an active circuit region, and includes a crack stop, which is adapted to protect the arrangement from the entry of deleterious moisture and combination into the active regions of the chip containing the bond pads.

10 Claims, 5 Drawing Sheets

U.S. PATENT DOCUMENTS

| | | | |
|---|---|---|---|
| 8,106,514 B2 * | 1/2012 | Nakashiba | 257/758 |
| 2004/0251970 A1 | 12/2004 | Fayneh et al. | |
| 2005/0026397 A1 | 2/2005 | Daubenspeck et al. | |
| 2005/0087878 A1 * | 4/2005 | Uesugi et al. | 257/758 |
| 2007/0102791 A1 * | 5/2007 | Wu | 257/618 |

OTHER PUBLICATIONS

D. Teomin, et al., "High Performance CMOS Fabricated on Hybrid Substrate With Different Crystal Orientations", *IEEE IEDM 2003*, pp. 18.7.1-18.7.4.

"Bios and Kernel Developer's Guide for AMD Athlon™ 64 and AMD Opteron™ Processors", Feb. 2006, Document No. XP002505671, pp. 261-294.

"Enhanced Intel® SpeedStep® Technology for the Intel® Pentium® M Processor—White Paper", Mar. 2004, Document No. XP002505672, pp. 1-12.

"Green Destiny and its Evolving Parts", Innovative Supercomputer Architecture, Jun. 2004, Wu-chun Feng and Chung-hsing Hsu.

"Power Efficient Resource Scaling in Partitioned Architectures through Dynamic Heterogeneity", Document No. XP1091098A, pp. 100-111, Mar. 2006.

"Dynamic Power-Performance Adaptation of Parallel Computation on Chip Multiprocessors", Jian Li and Jose F. Martinez, Feb. 2006.

United States Official Action dated Jul. 9, 2008 in corresponding U.S. Appl. No. 11/465,622.

United States Official Action dated Apr. 15, 2009 in corresponding U.S. Appl. No. 11/465,622.

United States Official Action dated Aug. 30, 2010 in corresponding U.S. Appl. No. 12/582,298.

United States Official Action dated Mar. 7, 2011 in corresponding U.S. Appl. No. 12/582,298.

United States Official Action dated Jun. 28, 2011 in corresponding U.S. Appl. No. 12/582,298.

* cited by examiner

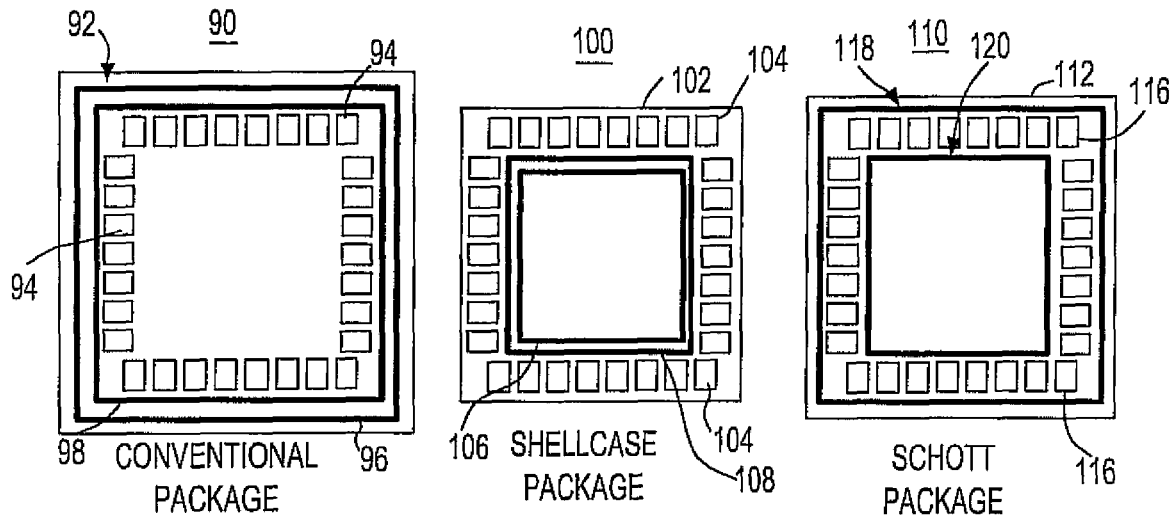
FIG. 2
PRIOR ART
FIG. 3
FIG. 4
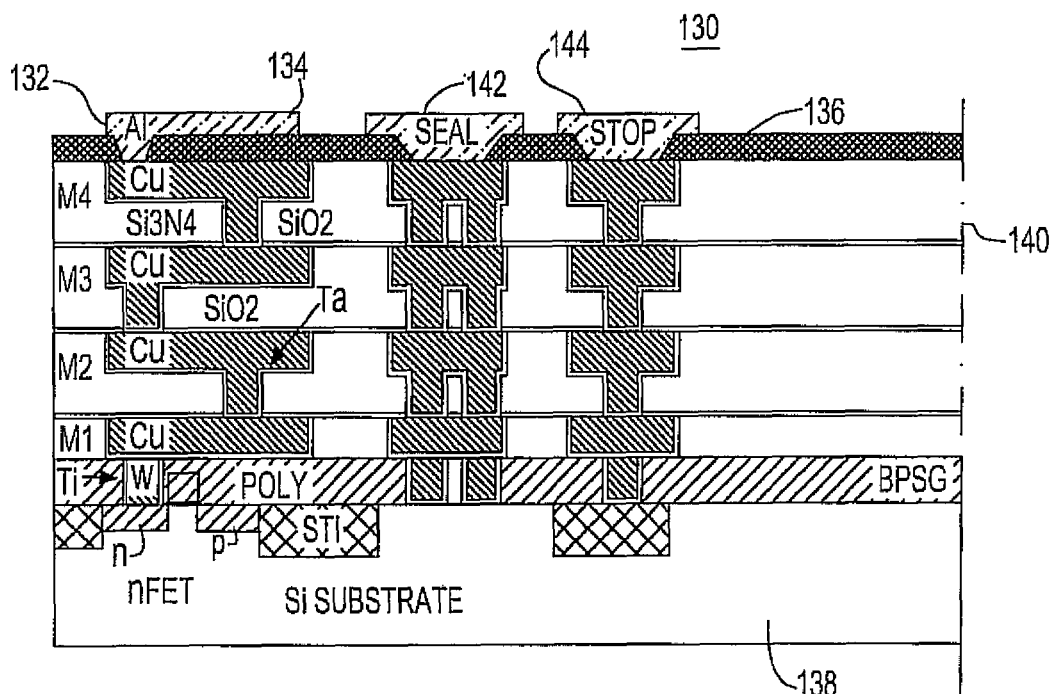
FIG. 5
PRIOR ART

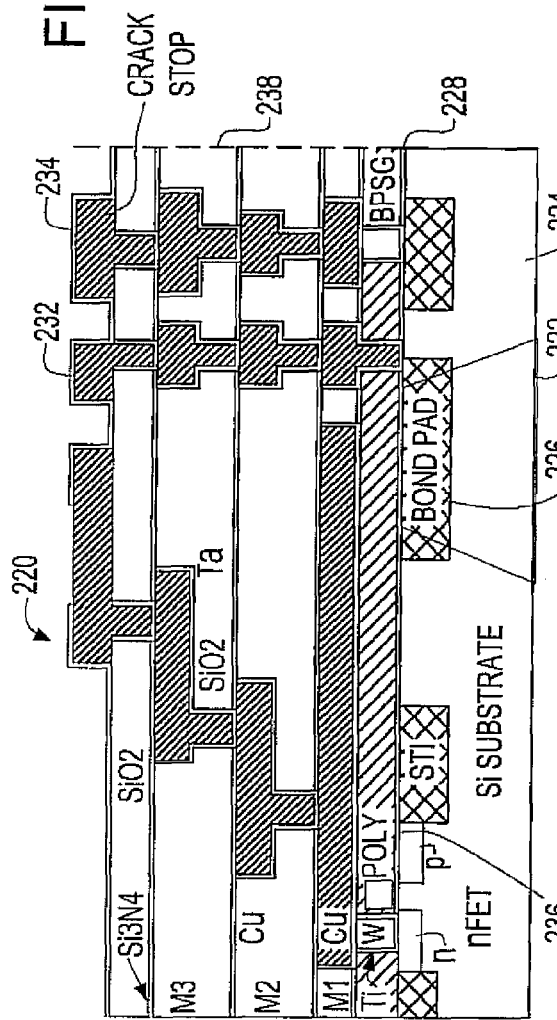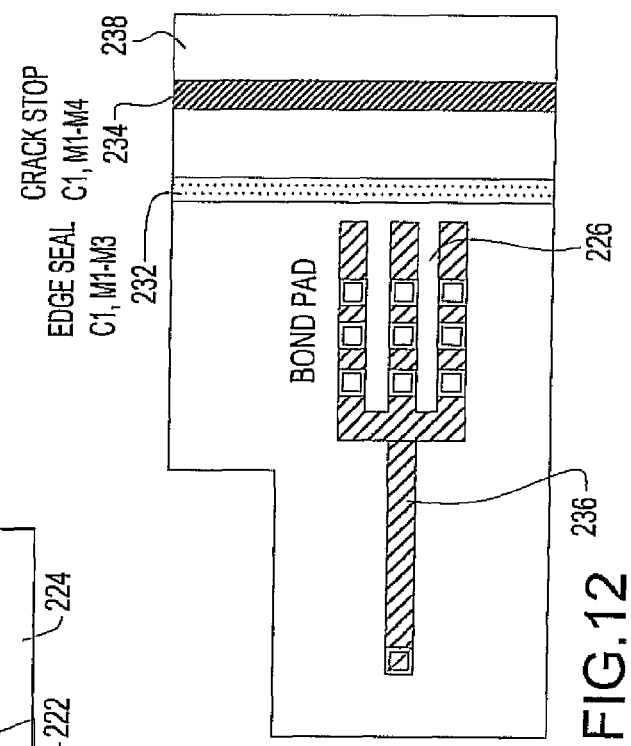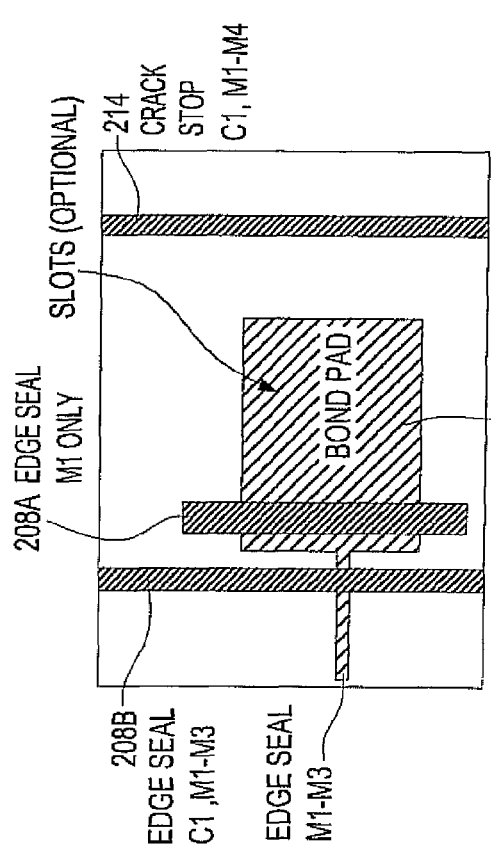

BOND PAD FOR WAFER AND PACKAGE FOR CMOS IMAGER

CROSS REFERENCE TO RELATED APPLICATION

This application is a divisional of U.S. patent application Ser. No. 12/582,298, filed on Oct. 20, 2009, which is a divisional of U.S. patent application Ser. No. 11/465,622, filed Aug. 18, 2006, now U.S. Pat. No. 7,622,364 issued on Nov. 24, 2009, the entire content and disclosure of which is incorporated herein by reference.

BACKGROUND OF THE INVENTION

1. Field of the Invention

The present invention relates to the provision of a bond pad for effecting through-wafer connections to an integrated circuit or electronic package, and wherein the bond pad includes a high surface area aluminum bond pad in order to resultingly obtain a highly reliable, low resistance connection between bond pads and electrical leads. In particular, the invention is directed to the addition of an edge seal between the bond pad region and an active circuit region, and includes a crack stop, which is adapted to protect the arrangement from the entry of deleterious moisture and combination into the active regions of the chip containing bond pads.

In the current state-of-the-technology, through-wafer connections are frequently employed in the formation of advanced types of electronic packages, for instance, such as, but not limited to, 3D packaging, MEMS packaging, or CMOS imager packaging. In particular, the process which is utilized for these connections is designed to etch a via through the rear side of the wafer and through the bond pads, so as to expose the edges of the respective bond pads. Leads are then formed so as to connect the edges of the bond pads to solder bumps, which are arranged on the rear sides of the electronic package. Thus, for multilevel aluminum (Al) wiring, multiple levels are employed in order to form the connection between the leads and the bond pads so as to be able to obtain low resistance electrical connections. However, when employing (Cu) copper wiring, this particular approach is subject to a poor or relatively low degree of reliability in the use of multiple Cu levels to form connections between the bond pads and leads, as a consequence of oxidation and corrosion of the copper material. A single aluminum pad is frequently employed as a final metal layer in Cu interconnects processes.

More recently, in order to improve upon the technology, novel structure has been developed, as is described and claimed in copending U.S. patent application Ser. No. 10/904,677, filed on Nov. 23, 2004, entitled "High Surface Area Aluminum Bond Pad For Through-Wafer Connections To An Electronic Package," which is commonly assigned to the present assignee, and the disclosure of which is incorporated herein by reference in its entirety.

That particular structure, as detailed in the above-mentioned copending application, may employ a single aluminum pad, but increases the surface area of this pad by forming via bars of either W (via bar width <2× the thickness of W) or W+Al (via bar width >2× the thickness of W) underneath the pad, or alternatively by adding metal on top of the pad.

Via bars can be readily formed using a standard via mask or by using an additional mask. The depth of the via bar can be enhanced in two ways: (1) through a use of RIE (reactive ion etch) lag to obtain a much greater etch depth for the via bar compared to the via, or (2) by using an additional mask to form the via bars before the vias. Hereby, the surface area can also be increased by using an isotropic etch of the dielectric which is selective with regard to the metal (dilute HF for $SiO_2$ dielectric, $O_2$ plasma for organic dielectric), so as to recess the edge of the package via with respect to the metal.

2. Discussion of the Prior Art

In essence, although this may be directed to various diverse components, said packaging arrangements, contamination and entry of moisture is encountered by the packages through either the rear or the side edges thereof, in which conventional crack stop and edge seals are ineffective in attempting to protect the chip when utilizing new packaging methods, such as those disclosed for devices as CMOS image sensors, including the known Schott package as described in the disclosure of "New Wafer-Level-Packaging Technology Using Silicon-Via-Contacts for Optical and Other Sensor Applications", by Jürgen Leib and Michael Töpper in the 2004 Electronic Components and Technology Conference Proceedings, pages 843-847, and Shellcase package, as described in "An Innovative Approach to Wafer-lever MEMS packaging," by D. Teomin, A. Badihi and G. Zilber (Shellcase Ltd., Manhat Technology Park) in Solid State Technology, V.45, n1; January 2002; pages 57-62. These packages access the bond pads from the rear or the sides of the wafer. As a result, the conventional crack stop and edge seal is not ordinarily adequate in protection of the chip when employing these new packaging arrangements and methods in the technology.

In the construction of other kinds of conventional devices, the crack stop and edge seals are also frequently inadequate to be able to preclude the entry of moisture and contaminating materials, which would adversely affect the functioning of the bond pads and the conventional electronics.

Moreover, the Shellcase packaging illustrates the crack stop and also the sealing or edge seal being arranged internally of the region of the bond pads, whereas in a Schott package, as known in the technology, a guard ring comprising a seal is arranged interiorly of the area surrounded by bond pads, the latter of which are then exteriorly encompassed by a guard ring.

SUMMARY OF THE INVENTION

Consequently, in one instance, as a protective measure against the ingress of moisture and contaminants, the present invention utilizes an edge seal and a crack stop, which are located inside the area encompassed by the bond pads on the surface of a semiconductor.

For a further type of package, such as the Shellcase package, the crack stop and edge seal are both arranged inside of the bond pad, the latter of which is accessed by the last metal layer, which is preferably constituted of aluminum. Active copper (Cu) interconnects in the active region (and the devices in the Si) are protected from moisture and contamination by the edge seal and by the SiN capping layer on top of the uppermost copper (Cu) layer.

Pursuant to this invention, a number of protective measures are available:

According to a first aspect, the through-via connects to the last metal layer (Aluminum), and the crack stop is outside of the bond pad and the edge seal is located inside the region of the bond pad.

Pursuant to a further embodiment, with regard to protection of the Schott package, the through-via connects to a local interconnect formed from the tungsten contacts and the edge seal is located inside the bond pad. An opening is provided in the edge seal so that the bond pad can connect to the interior of the chip without being electrically connected to the edge seal.

Furthermore, pursuant to another feature with regard to protecting the Schott package, the through-via connects to the tungsten (W) contacts, which are connected to the device region by an M1 or higher metal layer. The through-via etch stops on the SiN layer, which is located on top of the Si. This SiN layer protects copper (Cu) and devices from contaminants, which are associated with the through-via manufacturing process. The edge seal protects the copper (Cu) and devices from contaminants at the edge of the chip.

The foregoing structure thus quite clearly provides features, which are advantageous in the implementation of the present invention.

BRIEF DESCRIPTION OF THE DRAWINGS

Reference may now be made to the following detailed description of preferred embodiments of the invention, taken in conjunction with the accompanying drawings; in which:

FIG. 2 is a diagrammatic plan view of a conventional electronic package structure;

FIG. 3 is a diagrammatic plan view of a Shellcase package structure pursuant to the invention;

FIG. 4 is a diagrammatic plan view of a Schott package pursuant to the invention;

FIG. 5 is a diagrammatic sectional side view through a portion of a conventional electronic package;

FIG. 10 is a top plan view of a part of FIG. 9;

FIG. 11 is a diagrammatic sectional side view through a portion of a Schott package pursuant to a further modification of the invention; and FIG. 12 is a plan view of a part of FIG. 11.

DETAILED DESCRIPTION OF THE INVENTION

Figure 1A:
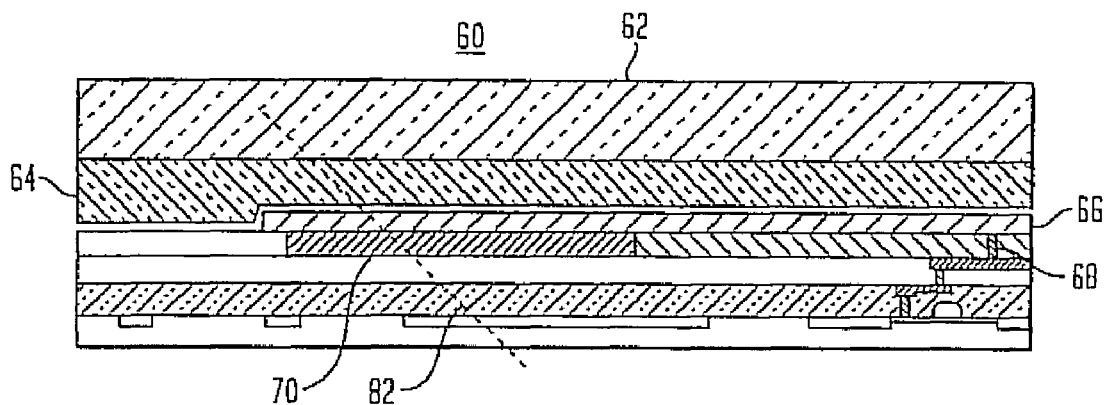
FIGS. 1A through 1C illustrate sequential steps in the formation of a structure utilizing via bars underneath bond pads, which may be utilized in the incorporation of crack stops and edge seals pursuant to the invention.
Figure 1B:
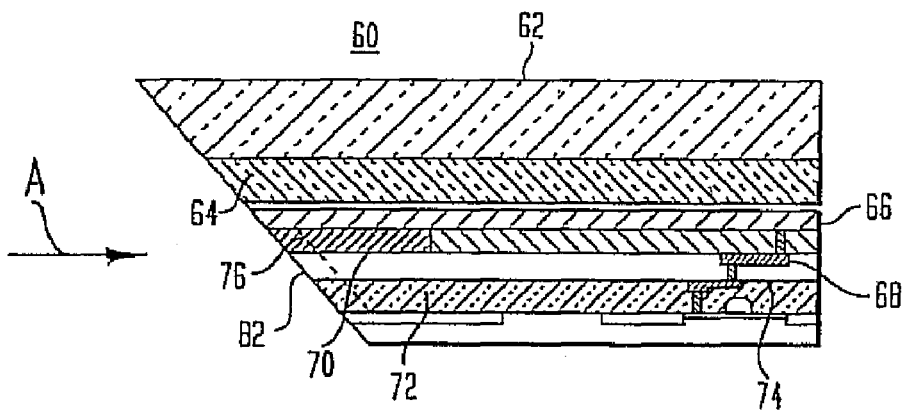
Figure 1C:
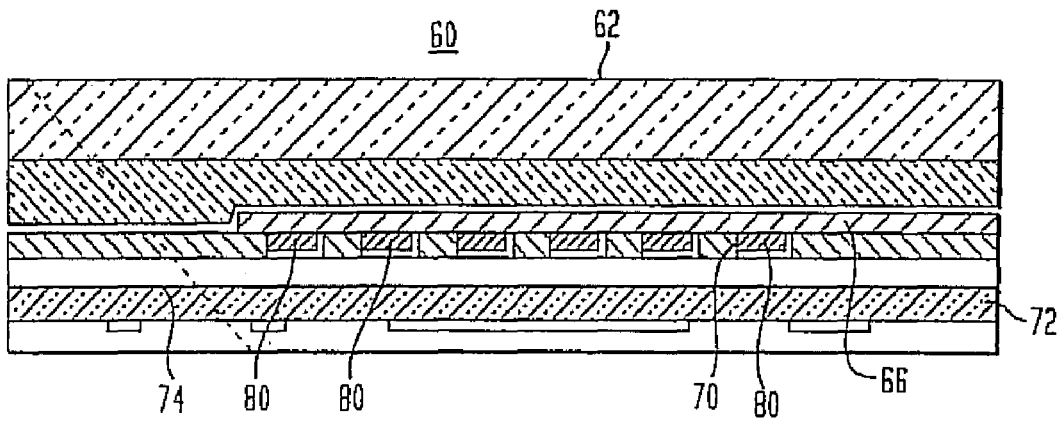

As disclosed in the above-mentioned copending application Ser. No. 10/904,677, the following electronic package structure is deemed to be of interest, as applied hereto:

A first one of an electronic package embodiment (W+Al via bar, no additional masks) is shown in FIGS. 1A through 1C of the drawings.

Reverting in greater particularity to the drawings, and especially as exemplified in FIGS. 1A through 1C, there is diagrammatically shown in FIG. 1A a side view of an electronic package 60 in which a notch has been formed to expose the bond pads. Provided is a glass plate 62, the back surface thereof including a polymer layer 64, and along the edges at one side consisting of silicon dioxide or silicon nitrate, and the rear surface of which is contacted by an Al or aluminum bond pad 66. A via 68 is provided beneath the bond pad 66. Tungsten (W) via bars 68 are provided at one end of bond pad 66, to provide connection to the circuits. Tungsten (W) via bar 70 is provided beneath the bond pads 66, and therebeneath a further glass plate is bonded thereto by means of epoxy and which forms the rear surface for the attachment thereto of BGA solder bumps (not shown). As shown in FIG. 1B of the drawings, which is a side view after the via etch has been implemented to the electronic package 60, there is indicated that in the structure thereof an optional isotropic etch 76 may be provided extending diagonally across one edge so as to increase the surface area of the bond pad 66. The via bars can also be formed from metals, such as tungsten, a combination of tungsten and aluminum, Cr, Au, Ni, NiMoP, Co, CoWP or CoWB. Copper leads may form a redistribution on top of a first BCB passivation layer and covered by a second BCB layer.

Additionally, the structure, as described hereinbelow, may also include a wafer level packaging arrangement, such as the known Schott package, supra, in which there is a discussion of via holes and streets being formed with tapered sidewalls by means of a highly specialized plasma etching process, and wherein the contact pads are open from the backside of the package etching through the interdielectric layer.

The edge 82 of the electronic package 60 may be cut at an angle relative to the normal for positioning of the leads interconnecting the bond pads. This eliminates the need for applying of the additional masks, as is provided for in the prior art.

An RIE lag can be used so that via bars 70 are at a greater depth than vias 68, and the isotropic etch, which is optional of the dielectric may be provided in connection with the type of metal employed where dilute HF is employed for $SiO_2$ dielectric, and $O_2$ plasma for an organic dielectric, for recessing or angling the edge of the package with regard to the metal. This also eliminates the requirement for an additional mask in comparison with the prior art.

An additional metal layer, such as aluminum, gold, silver, silicon based solder, lead based solder, palladium, platinum, chromium, nickel, copper or alloys thereof can be added on top of the bond pad after forming a terminal via. The additional metal is formed by using a shadow mask to deposit the metal, wherein the aluminum is evaporated, and, if required as well, a barrier layer, such as of titanium, tantalum, tungsten, tantalum nitrate, tungsten nitrate, or titanium tungsten. These materials are not shown in the drawings. Suitable electroplating or electroless plating may be employed to add the metal layer, whereby electroless plating requires no additional masks. On the other hand, electroplating may require one or two additional masks, which define a seed layer used to electroplate metal, as is known in the art. Thereafter, an optional isotropic etch may be applied after an electronic package etch, so as to increase the bond pad surface at an essentially angular relationship relative to the normal.

Referring to the top plan view of FIG. 2, this diagrammatically represents a conventional electronic package 90 pursuant to the prior art, showing a chip 92 including a plurality of bond pads 94, arrayed proximate the perimeter thereof, wherein a crack stop 96 and a guard ring 98, such as a seal, extends encompassingly exteriorly of the bond pads 94. This configuration would not inhibit the entry of moisture through the sides or the back of the package 90, and which may be detrimental to the efficacy in the functioning of the package circuitry (not shown), which is connected to the bond pads 94.

Turning, in particular, to the embodiment of the Shellcase package 100, as disclosed diagrammatically in FIG. 3 of the drawings, there is illustrated a semiconductor chip 102, which includes a peripheral array of bond pads 104 and in which a crack stop 106 and a guard ring forming a seal 108 are both arranged to extend internally of the perimeter of the bond pads 104. In that instance, inasmuch as these components 106, 108 are arranged internally of the region of the bond pads 104, this enables the Shellcase package 100 to be protected against the ingress of either moisture or contaminants.

With regard to the Schott package 110, which is diagrammatically illustrated in FIG. 4 of the drawings in a plan view, in that instance, a semiconductor chip 112 has a plurality of bond pads 116 arranged along the perimeter, and wherein externally encompassing the array of bond pads is a crack stop 118 in the shape of a ring, and wherein internally of the perimeter of the bond pads 114 is a guard ring forming a seal 120, so as to protect the bond pads from the ingress of moisture and/or any contaminants, pursuant to the inventive concept.

Referring in more specific detail to FIG. 5 of the drawings, in that instance, shown in a partial sectional side view, is a conventional semiconductor or electronic package 130, having probes 132 and bond pads 134 arranged on an upper layer 136 supported on an Si substrate 138. Interiorly of a dicing channel 140 there is provided an edge seal 142 about the bond pads, and extending thereabout is a crack stop 144 in a form of a continuous seal, as is known. This arrangement, in essence, would not provide an adequate structure for inhibiting the ingress of moisture and/or contaminants to the components or bond pads and connections of the electronic package.

Various optional arrangements for edge seals and crack stops in connection with Shellcase and Schott packages are set forth hereinbelow with references to FIGS. 6 through 12 of the drawings. For purposes of clarity, only package components concerned with the invention are identified with reference numerals, as applicable.

Figure 6:
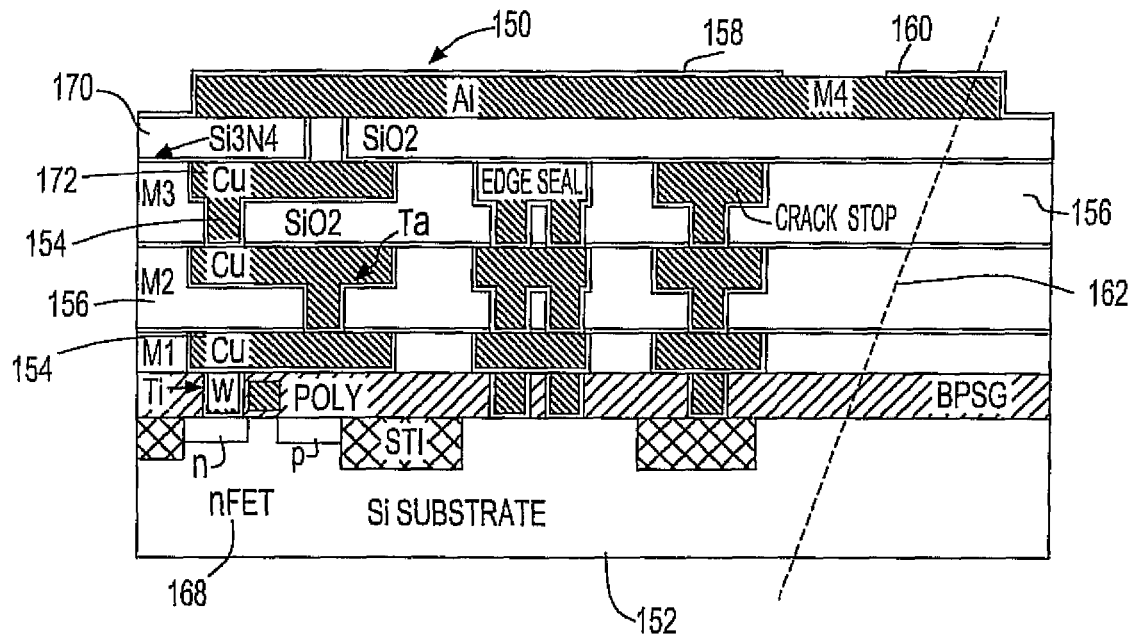
FIG. 6 is a diagrammatic sectional side view through a portion of the Shellcase package of FIG. 3.

As indicated in FIG. 6 of the drawings, there is illustrated the inventive arrangement of an edge seal and crack stop for a Shellcase package 150. Located on a silicon substrate 152 are the active copper connects 154 and intermediate SiO2 layers 156. A final layer 158 of aluminum facilitates access to a bond pad 160, shown within the edge of a dicing cut 162 formed along a dicing channel. In this instance, as also represented by FIG. 3 of the drawings, the edge seal 164 and the crack stop 166 (to seal cracks which are formed by the dicing process) are both located within the region of the bond pad 160 (or array of pads 104 in FIG. 3). Hereby, the active copper (Cu) interconnects 154 in the active region of the package 150, and the devices 168 in the Si layer or substrate 152 are protected from moisture and/or contamination by the edge seal 164, and by the $Si_3N_4$ capping layer 170 located on top of the uppermost Cu layer 172.

Set forth hereinbelow are various options in equipping a Schott package with edge seal and crack stop arrangements for preventing the ingress of moisture and/or contaminants into the package.

Figure 7:
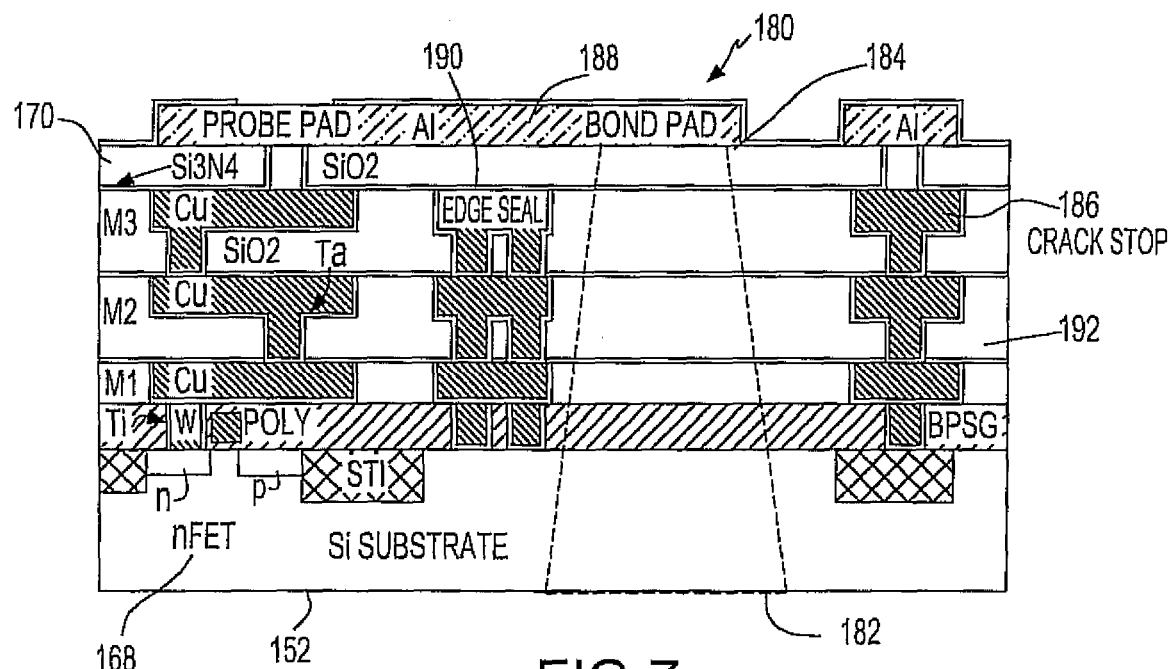
FIG. 7 is a diagrammatic sectional side view through a portion of the Schott package of FIG. 4.
Figure 8:
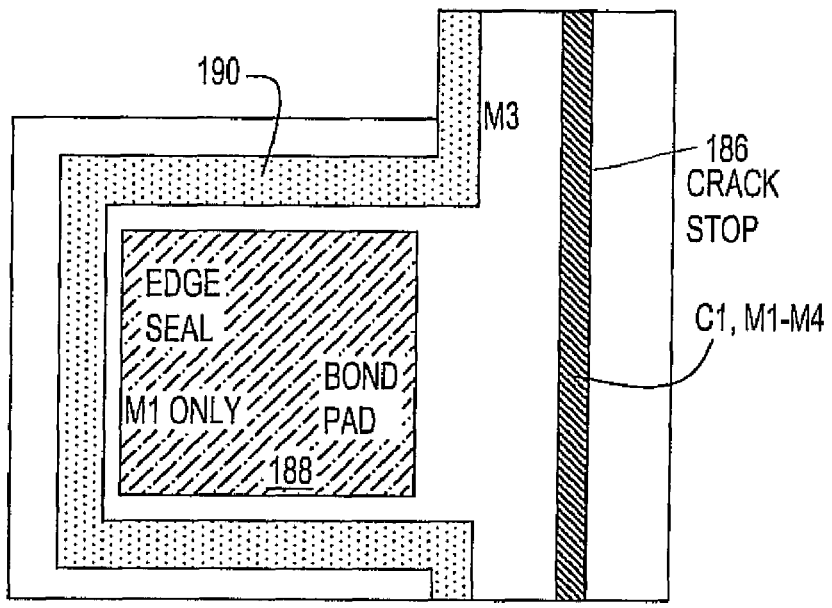
FIG. 8 is a diagrammatic plan view of an edge seal extending around a bond pad.

Reverting to FIGS. 7 and 8 of the drawings, there is illustrated a Schott package 180, wherein components in this and subsequent embodiments which are similar or identical with those in the package 150 of FIG. 6 are designed with the same reference numerals. In this particular embodiment of the invention (having also reference to the configuration shown in FIG. 4 of the drawings), the Schott package 180 includes a through-via 182 for packaging leads which connect to the uppermost or final metal layer 184, which may consist of aluminum (Al). Pursuant to the construction of this embodiment, as also detailed in the plan view of FIG. 8, the crack stop 186 is located externally of the bond pad 188 (or bond pad array 114 of FIG. 4) towards the edge or perimeter of the package (or chip 112). The edge seal 190, to the contrary, is located inwardly of the bond pad 188, extending about three sides thereof (as shown in FIG. 8 of the drawings).

The foregoing package construction in which the edge seal 190 encompasses three sides of the bond pad towards the package interior, and the exterior perimeter is sealed by means of the crack stop 186 adjacent a dicing cut 182 prevents the ingress of moisture and potential contaminants into the electronic components of the Schott package.

Figure 9:
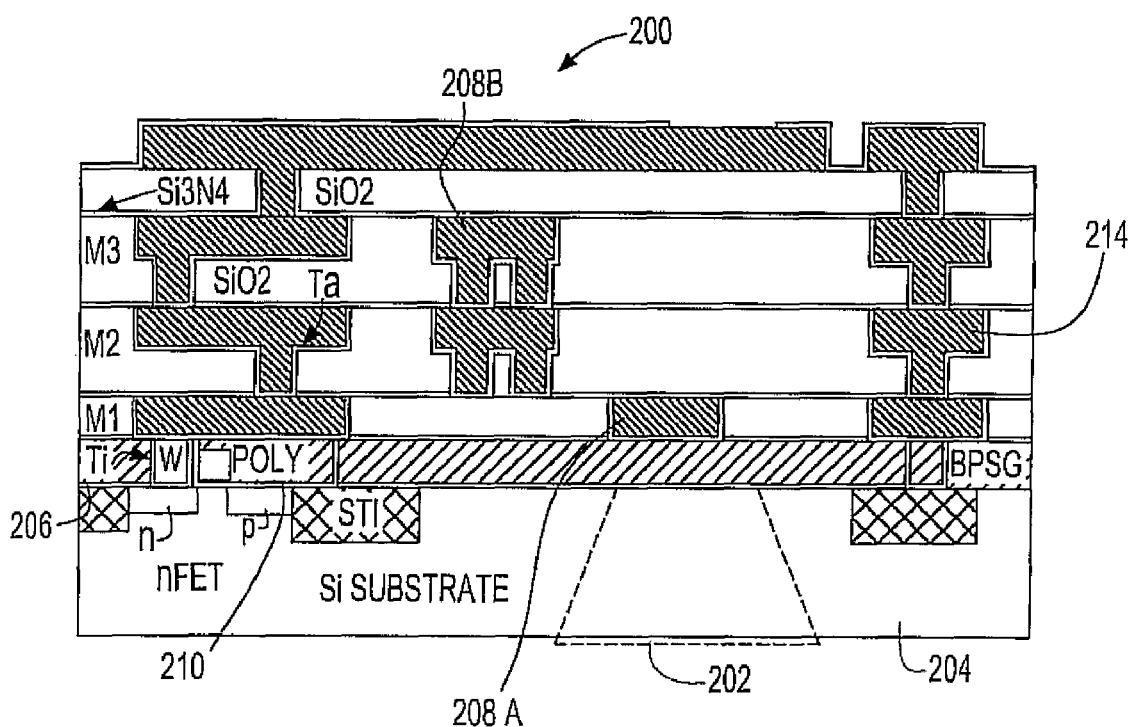
FIG. 9 is a diagrammatic sectional side view through a portion of a Schott package pursuant to a modification of the invention.

Reverting to FIGS. 9 and 10 of the drawings, these show a modified Schott package 200 in side sectional and plan views. In this embodiment, a through-via 202 extends through a substrate Si layer 204 to a local interconnect formed from tungsten (W) contacts 206. As illustrated, a lower portion of the edge seal 208A is located inside of the bond pad 210, with an opening 212 being formed in the edge seal to enable the bond pad 210 to connect to the interior for the chip without being electrically connected to the edge seal, the latter of which has a remainder 208B extending upwardly. As in the preceding embodiment, a crack stop 214 extends outwardly of the bond pad proximate the perimeter of the package structure. This again provides a novel structure for guarding the electronic package components against the ingress of moisture and/or contaminants.

As disclosed in FIGS. 11 and 12 of the drawings, there is shown a sectional and top plan view of a portion of a further Schott package 220. Pursuant to the package construction, a through-via 222 extends through the substrate Si layer 224 and bond pad 226 to tungsten (W) contacts 228, or to a higher metal layer (consisting preferably of Cu connects/layers). The through-via edge seal 232 stops at a $Si_3N_4$ layer 236, which is located on top of the Si substrate layer 224, whereby this $Si2N_4$ layer protects Cu contacts and layers and devices in the package from contaminants generated in the formation of the through-via. The edge seal 232 and outwardly located crack stop 234 at the perimetrical edge of the package (or semiconductor chip) proximate a dicing cut 238 forming a dicing channel, protects the Cu components and electronic devices in the package 220 from contaminants at the edges thereof and from the ingress of water.

From the foregoing, it becomes quite apparent that the novel arrangements and locations of the crack stops and edge seals or rings employed the various types of electronic package structures, provide a secure guard against the ingress of moisture and/or contaminants, which would tend to have an adverse effect of the operation and the reliability of the electronic package.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but to fall within the spirit and scope of the appended claims.

What is claimed is:

1. An electronic package including a semiconductor chip having a plurality of electrically connected layers arranged on a substrate and at least one bond pad positioned on an upper surface of said semiconductor chip, said electronic package comprising structure extending between said at least one bond pad and said substrate for protecting electrical connections and components contained therein from an ingress of moisture and contaminants, wherein said protective structure includes an edge seal and a crack stop each forming a ring-shaped arrangement extending in a mutually spaced relationship about the periphery of said at least one bond pad.

2. An electronic package as claimed in claim 1, wherein a through-via for packaging leads extends through said substrate layer and active layers of said semiconductor chip to said bond pads.

3. An electronic package as claimed in claim 1, wherein said edge seal extends partially about the edge portion of the respective bond pads in an active layer, which is located on said substrate layer.

4. An electronic package as claimed in claim 1, wherein said bond pad array is located on said substrate layer, and at least one probe pad comprises a top layer of said electronic package, said edge seal having an upper portion forming an opening with a lower edge seal portion so as to facilitate connection of said bond pads to the interior of said semiconductor chip in the absence of being electrically connected to said edge seal.

5. An electronic package as claimed in claim 1, wherein a through-via extends through the substrate layer and bond pads to tungsten contacts or higher metal layers in the electronic package; the edge seal extending from the top layer to a $Si_3N_4$ layer located on said substrate layer so as to, in conjunction with the crack stop, protect the electrical component and devices in the package from the ingress of moisture and contaminants.

6. An electronic package as claimed in claim 1, wherein said edge seal and crack stop inhibit the ingress of moisture and contaminants from the rear edge and sides of said electronic package.

7. An electronic package as claimed in claim 6, wherein said crack stop prevents the propagation of cracks and fissures into said electronic package resulting from dicing cuts separating said semiconductor chip from a wafer.

8. An electronic package as claimed in claim 1, wherein said edge seal and crack stop extend between a capping layer between said bond pad array and said substrate layer.

9. An electronic package as claimed in claim 8, wherein said capping layer comprises $Si_3N_4$ and is located on an uppermost electrically-conductive metal layer.

10. An electronic package as claimed in claim 8, wherein said substrate layer comprises Si and contains active devices which are protected by said edge seal and crack stop arrangements.

* * * * *